(12) United States Patent
Robling

(10) Patent No.: US 9,306,510 B1
(45) Date of Patent: Apr. 5, 2016

(54) FREQUENCY DEPENDENT DUAL SOLID-STATE AND VACUUM TUBE POWER AMPLIFIER-SECTION INSTRUMENT AMPLIFIER

(71) Applicant: Jason O. Robling, Frederick, MD (US)

(72) Inventor: Jason O. Robling, Frederick, MD (US)

( * ) Notice: Subject to any disclaimer, the term of this patent is extended or adjusted under 35 U.S.C. 154(b) by 38 days.

(21) Appl. No.: 13/943,367

(22) Filed: Jul. 16, 2013

Related U.S. Application Data

(60) Provisional application No. 61/671,840, filed on Jul. 16, 2012.

(51) Int. Cl.
*H03F 99/00* (2009.01)
*H03F 3/181* (2006.01)

(52) U.S. Cl.
CPC .................................. *H03F 3/181* (2013.01)

(58) Field of Classification Search
CPC .............. H03F 1/36; H03F 1/54; H03F 1/50; H03F 1/20; H03F 1/18; H03F 1/0288; H03F 3/24; H03F 3/60; H03F 3/68; H03F 3/211; H03F 3/601; H03F 3/602; H03F 3/604; H03F 3/605; H03F 3/607; H03F 3/3081; H03F 3/45475; H03F 2200/451; H03F 2200/198; H03F 2200/294; H03F 2200/111

USPC .................... 330/295, 124 R, 84, 286, 53
See application file for complete search history.

(56) References Cited

U.S. PATENT DOCUMENTS

| | | | | |
|---|---|---|---|---|
| 4,991,221 A | * | 2/1991 | Rush | 381/120 |
| 5,129,006 A | * | 7/1992 | Hill et al. | 381/100 |
| 5,705,950 A | * | 1/1998 | Butler | H03F 1/327 |
| | | | | 330/100 |
| 6,140,870 A | * | 10/2000 | Cook | H03F 3/28 |
| | | | | 330/118 |
| 8,139,782 B2 | * | 3/2012 | Hughes | 381/86 |
| 8,200,349 B2 | * | 6/2012 | Chung | 700/94 |

* cited by examiner

*Primary Examiner* — Hieu Nguyen
(74) *Attorney, Agent, or Firm* — James Creighton Wray

(57) ABSTRACT

An audio amplifier apparatus and method which has a preamp, active 2-way crossover, solid-state power amplifier, and tube power amplifier. Audio input from a musical instrument enters the preamp where pre-amplification, equalization, and other processes such as limiting or compression take place. Audio leaves the preamp and goes to a crossover, wherein frequencies below a crossover point are sent to a solid-state power amp via a first signal path, and wherein audio frequencies above the crossover point are sent to a tube power amp via a second signal path. Outputs from the solid-state power amp and tube power amp are sent to external or internal loudspeakers.

14 Claims, 3 Drawing Sheets

FREQUENCY DEPENDENT DUAL SOLID-STATE AND VACUUM TUBE POWER AMPLIFIER-SECTION INSTRUMENT AMPLIFIER

This application claims the benefit of U.S. Provisional Application No. 61/671,840 filed Jul. 16, 2012, which is hereby incorporated by reference in its entirety as if fully set forth herein.

SUMMARY OF THE INVENTION

The present invention is a self-contained musical instrument amplifier that enables the musician to take advantage of both solid-state and vacuum-tube power amp technology, simultaneously.

The topology of the amplifier is as follows: The mono audio input from an instrument, such as an electric bass guitar, is plugged into the amplifier's pre-amp section. The signal then feeds an internal active 2-way crossover, which is a device used in various audio applications to split the audio signal depending on a preset or selectable frequency point. In this application, all frequencies below the crossover point are sent to the solid-state power-amp section, and all frequencies above the crossover point are sent to the tube power-amp section. The outputs of these two power-amp sections are then sent to either internal, or external loudspeakers.

Because of the many desirable audio qualities of vacuum tubes, and in particular power-section tubes, most musicians would prefer to use amplifiers with tube technology (note: many currently available instrument amplifiers that use solid-state power sections do use one or more preamp tubes in the preamp section. This is not however, what creates the desirable 'tube' sound that most musicians prefer. This preferable tube-sound is achieved primarily by an amplifier with a power section using output power tubes). However, many musicians that play electric instruments capable of producing lower bass frequencies, such as the electric bass-guitar or keyboard, will often use amplifiers with completely solid-state power sections for mainly two reasons: First, for a tube amp to reproduce and amplify bass frequencies with enough volume without clip (distortion) requires more energy, weight, and expensive hardware, than from a solid-state power amplifier. Second, many of these same musicians do prefer the clean, loud, and 'tight' sound of low/bass frequencies through a solid-state amplifier, but as they move upward into the middle and higher frequencies on the instrument, the sound quality becomes less desirable, or more 'harsh,' due to the inherent sonic qualities of solid-state amplification.

The present invention allows the musician to take advantage of the most desirable aspects of each of the solid-state and tube power amp sections. Because only the middle and high frequencies will be reproduced and amplified by the tube power section, this power section only needs to produce a fraction of the output power, or wattage, of a tube-only amplifier, since the solid-state power section will be amplifying the more power-requiring lower bass frequencies. For use with a bass guitar or keyboard, the crossover frequency point should be somewhere in the range of approximately 80 Hz to 240 Hz, although this is somewhat subjective, and higher frequency crossover points may be used.

Another advantage of the invention is that even when the amplifier is being input with a bass note that is below the crossover point, and therefore being sent to the solid-state power section, every musical note contains not only the fundamental frequency, but additional overtones (including higher-order harmonics), that are higher in frequency than the fundamental tone. This means that while the fundamental tone/note is sent to the solid-state power amp section, these higher frequency overtones are sent to the tube power section, resulting in a very pleasing and musical result, or timbre, of the two power sections, where the fundamental is tight, clear, and loud, and the overtones are smooth, warm, and round (these are musician vernacular terms for the desirable 'tube sound').

There are many features that could be added to the topology which would add versatility, both for sound, and reliability. For example, a blend potentiometer (knob/pot) could be added which would allow the musician to add some (or all) of the middle and high frequencies to the solid-state power section, or vice-versa, thus giving the musician the ability to blend the two 'sides' across the whole frequency range of their instrument. A 'balance'-type potentiometer could be added in conjunction with the master volume to adjust for slight differences in volume taper between the two power-amp sections as the amplifier is turned up, or down. Additionally, or alternatively, a switch could be added which would allow the musician to use just the solid-state section for full-range amplification, or just the tube power section for full-range amplification. This would be desirable for a variety of reasons, but practically for example, if a power-tube were to fail during a performance (which does happen occasionally under normal use), the musician could switch to full-range/solid-state, and finish the performance.

These and further objects and features of the invention are apparent in the disclosure, which includes the above and ongoing written specification, with the claims and the drawings.

DETAILED DESCRIPTION

The drawings are for the purpose of illustrating the inventor's preferred embodiments and not for the purpose of limiting the invention.

Figure 1:
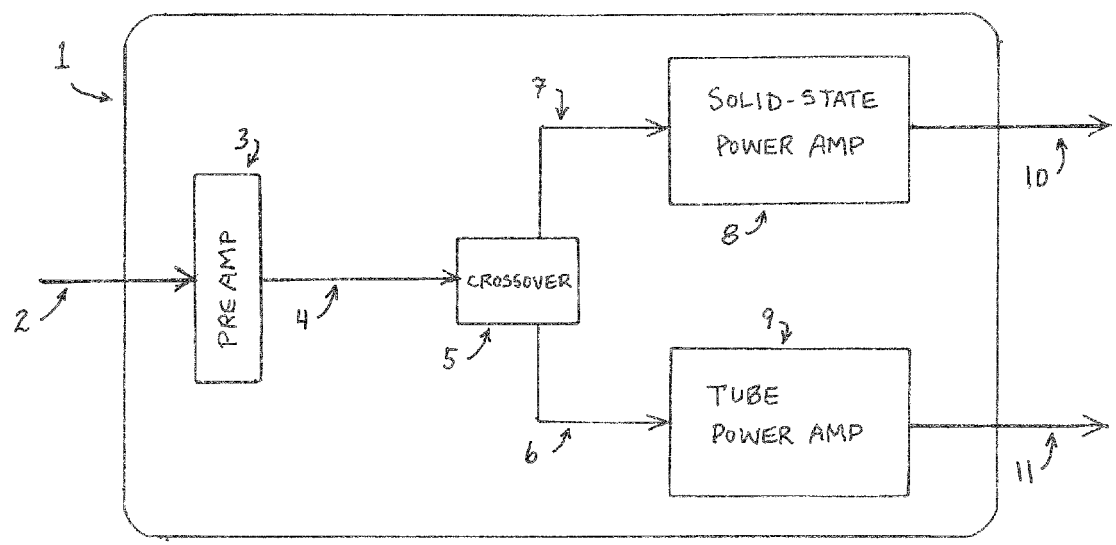
FIG. 1 is a schematic overview of the topology of the amplifier, with the external housing/enclosure, preamp, active 2-way crossover, and power amp sections.

FIG. 1 shows the amplifier 1, which includes the preamp 3, active 2-way crossover 5, solid-state power amplifier 8, and tube power amplifier 9. The audio input from a musical instrument is shown 2, enters the preamp, where pre-amplification and equalization occur, and other processes such as limiting and/or compression may also take place. The audio 4, leaves the preamp and goes to the crossover 5, where audio frequencies below the crossover point are sent to the solid-state power amp 8, via signal path 7. Signal path 4 is where a common effects-loop and/or direct-out would be located. Audio frequencies above the crossover point are sent to the tube power amp 9, via signal path 6. The outputs 10 and 11 are sent to external loudspeakers.

Figure 2:
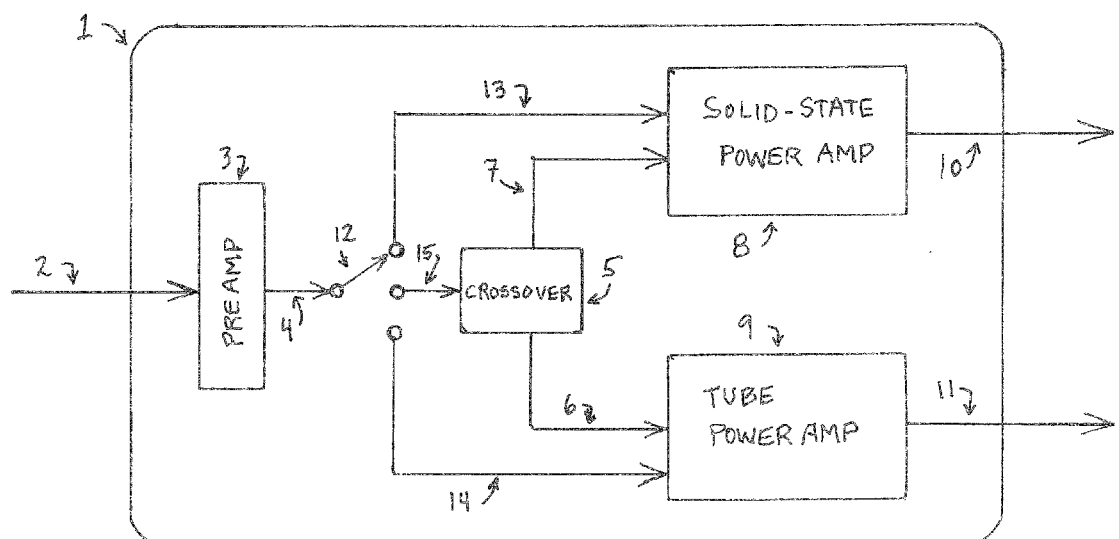
FIG. 2 is the same as FIG. 1, with the addition of a switch, allowing for various signal routing to either the crossover, the solid-state power amp only, or the tube power amp only.

FIG. 2 shows the addition of a switch 12 which allows the selection of sending the full-range audio 12 to the solid-state power amp 8 only, via signal path 13, or sending signal 12 to the tube power amp 9 only, via signal path 14, or sending signal 12 to the crossover 5 via signal path 15.

Figure 3:
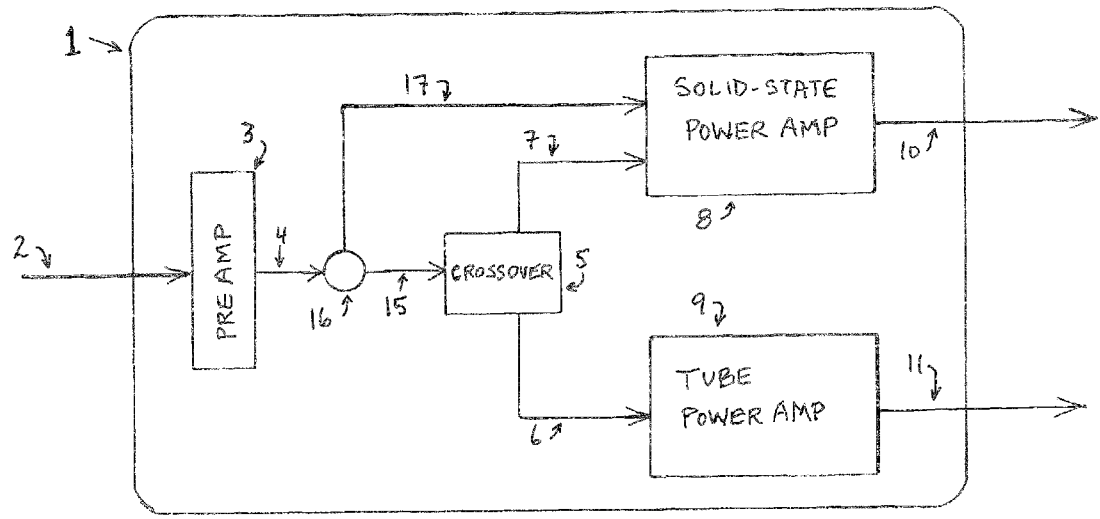
FIG. 3 is the same as FIG. 1, with the addition of a 'blend/mix' potentiometer between the preamp and the crossover.

FIG. 3 shows the addition of a pan/mix/blend potentiometer 16 placed between the preamp 3 and crossover 5 which enables sending a variable amount of full-range audio 17 to the solid-state power amp 8, in addition to signal 7 that has been sent via 15 to the crossover 5. Alternatively, this process can be done with the tube power amp instead of the solid-state power amp.

Figure 4:
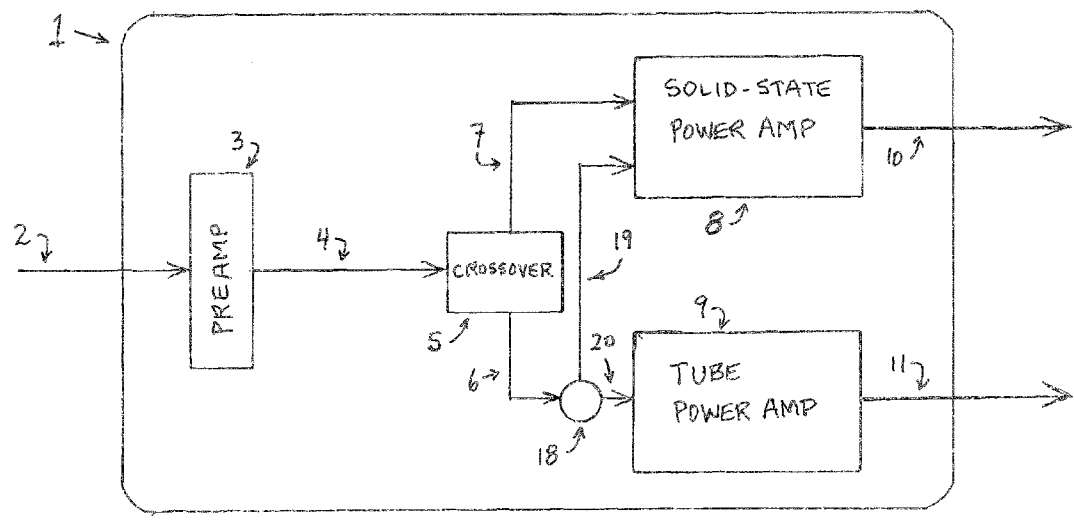
FIG. 4 is the same as FIG. 1, with the addition of a 'blend/mix' potentiometer between the crossover and the tube power amp section.

FIG. 4 shows the addition of a pan/mix/blend potentiometer 18 placed between the crossover 5 and the tube power amp 9, which enables sending a variable amount of higher frequencies 19 to the solid-state power amp 8. Tube power amp 9 still receives a variable amount of signal from potentiometer 18 via signal path 20.

Figure 5:
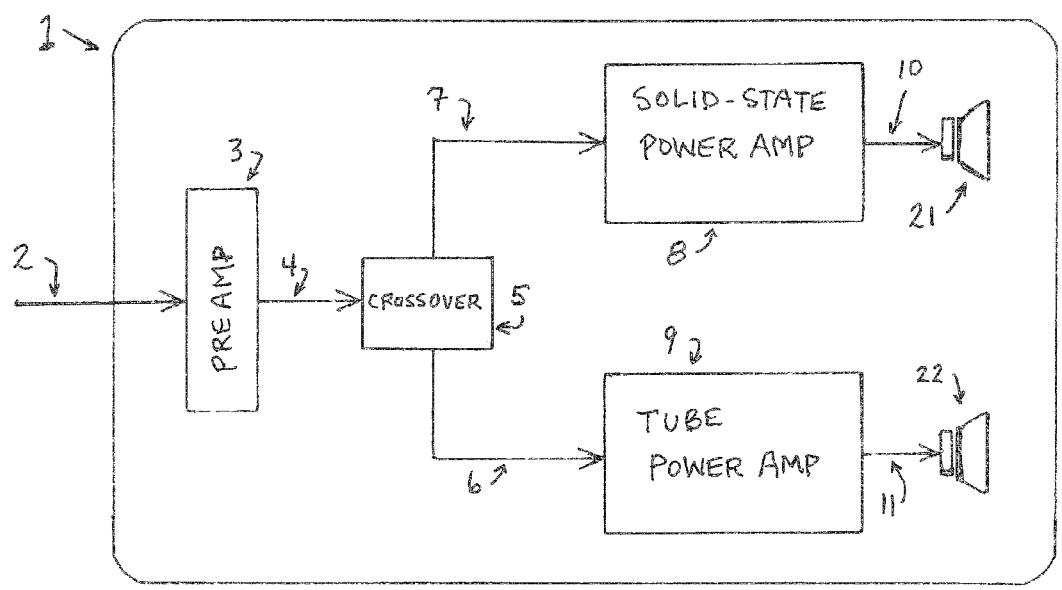
FIG. 5 is the same as FIG. 1, with the addition of loudspeakers in the enclosure.

FIG. 5 shows the amplifier with the addition of internal speakers 21 and 22, supplied with audio via 10 and 11 from solid-state power amp 8 and tube power amp 9.

While the invention has been described with reference to specific embodiments, modifications and variations of the invention may be constructed without departing from the scope of the invention, which is defined in the following claims.

I claim:

1. Apparatus comprising an audio amplifier, further comprising:
   an audio input adapted to be connected to a sound source,
   a preamplifier connected to the audio input,
   a preamplifier output path connected to the preamplifier,
   a crossover connected to the preamplifier output path,
   a first signal path connected to the crossover,
   a second signal path connected to the crossover,
   the crossover adapted for directing first audio frequencies below a crossover point to the first signal path and second audio frequencies above the crossover point to the second path,
   a first power amplifier connected to the first signal path,
   a second power amplifier connected to the second signal path,
   wherein the first and second power amplifiers are distinct types of power amplifiers, wherein the first power amplifier comprises a solid state amplifier and the second power amplifier comprises a tube power amplifier,
   a first power amplifier output connected to the first power amplifier, and
   a second distinct power amplifier output connected to the second power amplifier.

2. The apparatus of claim 1, wherein the audio amplifier is self-contained.

3. The apparatus of claim 1, wherein the first audio frequencies are relatively low audio frequencies and the second audio frequencies are relatively middle and high audio frequencies.

4. The apparatus of claim 2, further comprising a selectable switch connected to the preamplifier output between the preamplifier and the crossover, the switch having an input connected to the preamplifier and having a first selectable switch output connected to the first power amplifier, a second selectable switch output connected to the second power amplifier and a third selectable switch output connected to the crossover.

5. The apparatus of claim 2, further comprising a potentiometer connected to the preamplifier output and connected to one of the first and second power amplifiers for selectively apportioning a preamplifier signal on the preamplifier output to the crossover and to the one of the first and second power amplifiers and to the crossover.

6. The apparatus of claim 2, further comprising a potentiometer connected to the preamplifier output and connected to the first power amplifier for selectively apportioning a preamplifier signal on the preamplifier output to the crossover and to the first power amplifier and to the crossover and to the second power amplifier.

7. The apparatus of claim 2, further comprising a potentiometer connected to the second signal path and to the first power amplifier for selectively apportioning a signal from the crossover in the second signal path between the second power amplifier and the first power amplifier.

8. The apparatus of claim 2, further comprising first and second speakers connected to the first and second power amplifier outputs.

9. The apparatus of claim 2, further comprising first and second internal speakers connected to the first and second power amplifier outputs within the self-contained audio amplifier.

10. A method comprising:
    providing a self-contained amplifier,
    providing a solid-state power amplifier and a tube power amplifier in the self-contained amplifier,
    providing a preamplifier and a crossover connected to the preamplifier in the self-contained amplifier,
    receiving and preamplifying audio frequency signals in the preamplifier,
    separating in the crossover the preamplified audio frequency signals below and above the selected crossover frequency point, thereby separating signals into relatively lower frequency preamplified signals and separate relatively higher frequency preamplified signals,
    directing the relatively lower frequency preamplified signals from the crossover to the solid state power amplifier, and
    directing the relatively higher frequency preamplified signals from the crossover to the tube power amplifier.

11. The method of claim 10, further comprising providing a selector switch between the preamplifier and the crossover, selectively sending all of the preamplified signals to the crossover, all of the preamplified signals to the solid state power amplifier or all of the preamplified signals to the tube power amplifier with the selector switch.

12. The method of claim 10, further comprising providing a potentiometer between the preamplifier and the crossover, connecting the potentiometer to the solid-state amplifier, and apportioning the preamplified signals between the solid-state amplifier and the crossover with the potentiometer.

13. The method of claim 10, further comprising providing a potentiometer between the crossover and the tube power amplifier, connecting the potentiometer to the solid-state power amplifier and apportioning preamplified signals from the crossover between the solid-state power amplifier and the tube power amplifier with the potentiometer.

14. The method of claim 10, further comprising providing speakers in the self-contained amplifier, connecting the speakers respectively to an output of the solid-state power amplifier and to an output of the tube power amplifier and producing sounds from the speakers in the self-contained amplifier.

* * * * *